United States Patent
Baniecki et al.

(10) Patent No.: US 9,269,883 B2
(45) Date of Patent: Feb. 23, 2016

(54) THERMOELECTRIC CONVERSION DEVICE

(71) Applicant: FUJITSU LIMITED, Kawasaki-shi, Kanagawa (JP)

(72) Inventors: John David Baniecki, Zama (JP); Masatoshi Ishii, Kawasaki (JP); Kazuaki Kurihara, Atsugi (JP); Kazunori Yamanaka, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/539,028

(22) Filed: Nov. 12, 2014

(65) Prior Publication Data

US 2015/0053247 A1 Feb. 26, 2015

Related U.S. Application Data

(63) Continuation of application No. PCT/JP2012/062338, filed on May 14, 2012.

(51) Int. Cl.
| | |
|---|---|
| H01L 35/00 | (2006.01) |
| H01L 35/32 | (2006.01) |
| H01L 35/22 | (2006.01) |
| H01L 35/02 | (2006.01) |
| H01L 35/26 | (2006.01) |
| H01L 35/12 | (2006.01) |
| H01L 35/14 | (2006.01) |

(52) U.S. Cl.
CPC ............ *H01L 35/325* (2013.01); *H01L 35/22* (2013.01); *H01L 35/32* (2013.01); *H01L 35/00* (2013.01); *H01L 35/02* (2013.01); *H01L 35/12* (2013.01); *H01L 35/14* (2013.01); *H01L 35/26* (2013.01)

(58) Field of Classification Search
CPC ......... H01L 35/00; H01L 35/02; H01L 35/22; H01L 35/26; H01L 35/325; H01L 35/32
USPC ...................................... 136/200, 236.1, 239
See application file for complete search history.

(56) References Cited

U.S. PATENT DOCUMENTS

| 5,793,092 A | 8/1998 | Habermeier | |
|---|---|---|---|
| 7,872,253 B2 * | 1/2011 | Ohta | G01J 5/08 136/239 |

(Continued)

FOREIGN PATENT DOCUMENTS

| JP | H08-247851 | 9/1996 |
|---|---|---|
| WO | WO 2007/020775 A1 | 2/2007 |
| WO | WO 2007/132782 A1 | 11/2007 |

OTHER PUBLICATIONS

J.M.O. Zide, et al.; "Demonstration of electron filtering to increase the Seebeck coefficient in In0.53Ga0.47As/In0.53Ga0.28Al0.19As superlattices;" Physical Review B74; 2006; pp. 205335-1-205335-5 (5 Sheets total).

(Continued)

*Primary Examiner* — Matthew Martin
(74) *Attorney, Agent, or Firm* — Kratz, Quintos & Hanson, LLP

(57) ABSTRACT

A thermoelectric conversion device includes a stack in which a first perovskite dielectric film, which includes Sr and Ti and has a first bandgap, and a second perovskite dielectric film, which includes Sr and Ti and has a second bandgap smaller than the first bandgap, are stacked alternately, each of the first and second perovskite dielectric films being doped to have an electric conductivity, the first and the second perovskite dielectric films having respective compositions such that there appears a bandoffset of 0.54 eV in maximum between a conduction band of the first perovskite dielectric film and a conduction band of the second perovskite dielectric film.

8 Claims, 11 Drawing Sheets

(56) References Cited

U.S. PATENT DOCUMENTS

2007/0102034 A1   5/2007   Kanno
2009/0173932 A1   7/2009   Ohta

OTHER PUBLICATIONS

International Search Report for International Application No. PCT/JP2012/062338 dated Jul. 17, 2012.

* cited by examiner

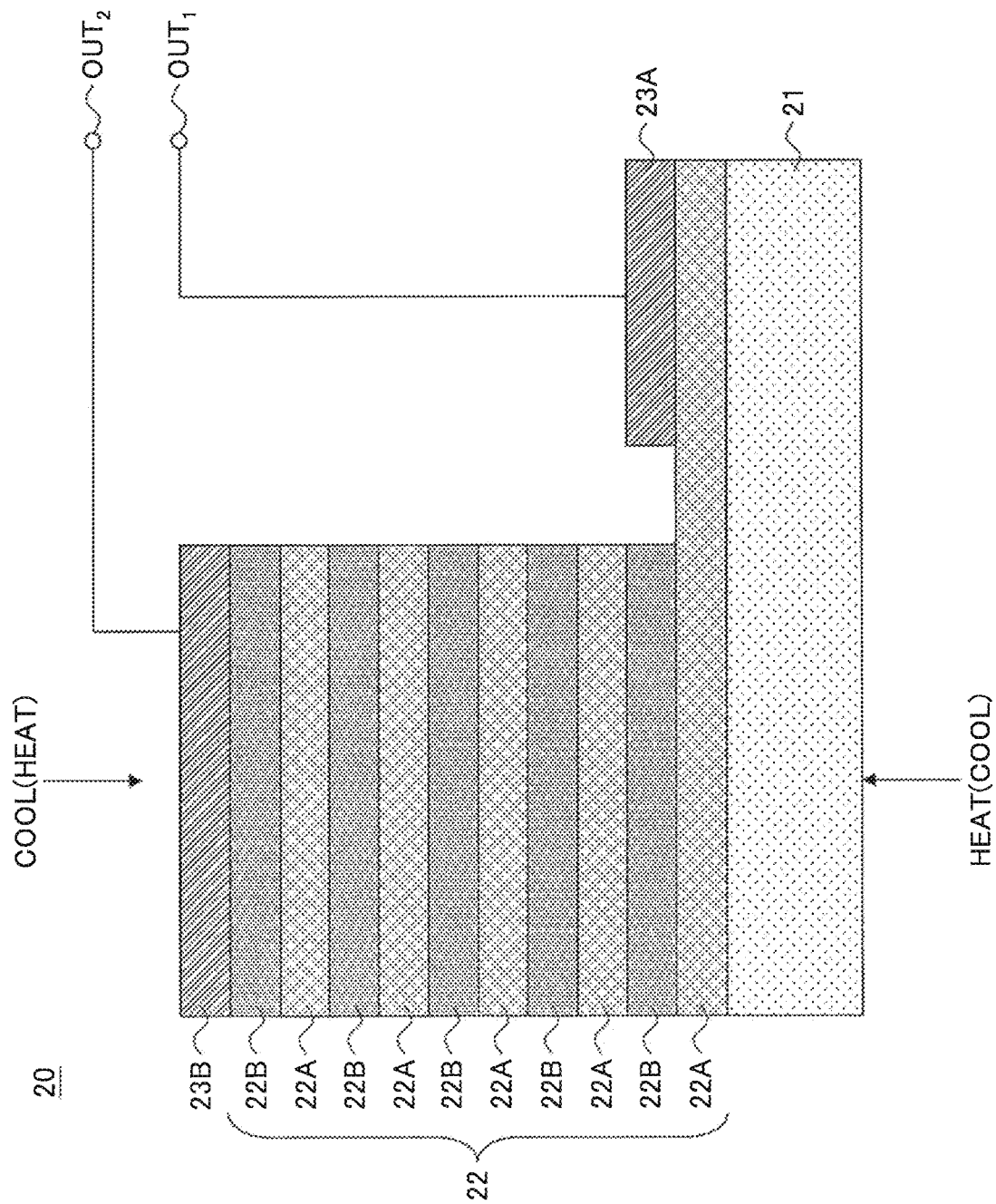

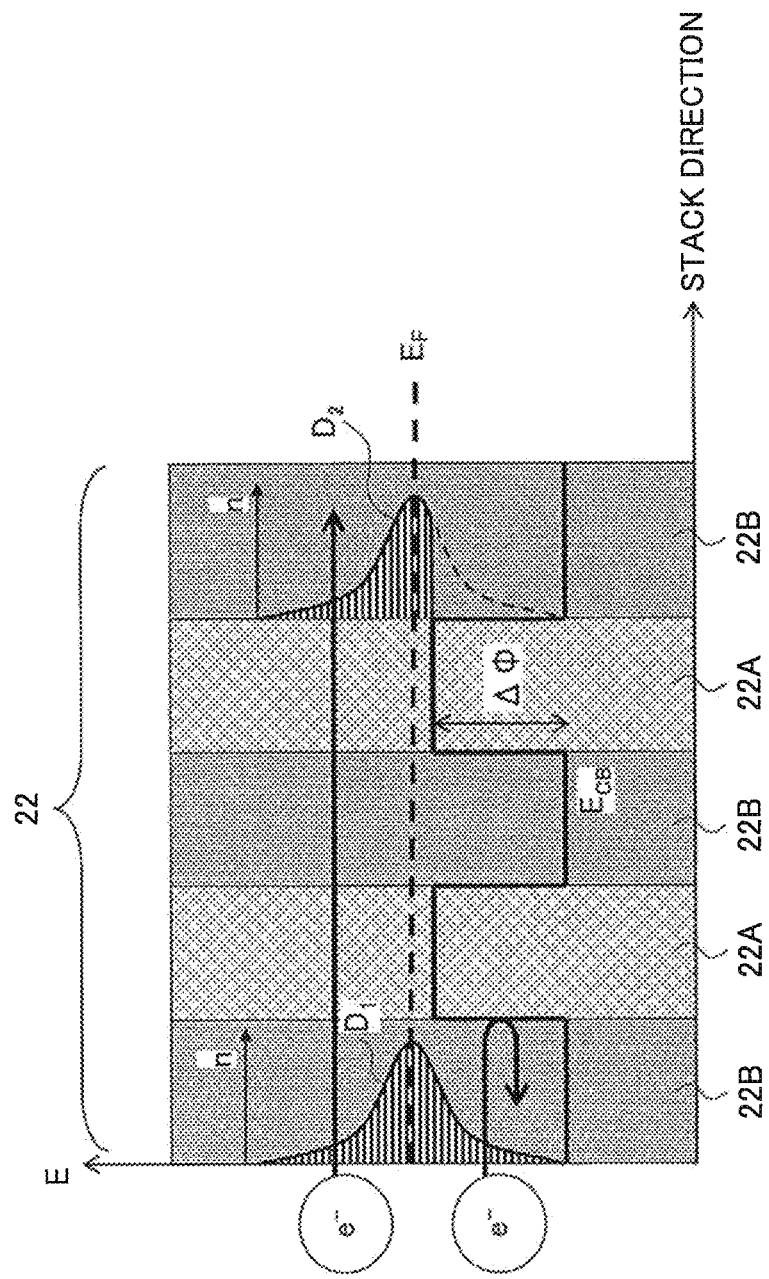

THERMOELECTRIC CONVERSION DEVICE

CROSS-REFERENCE TO RELATED APPLICATIONS

This application is a continuation application of International Application PCT/JP2012/062338 filed on May 14, 2012 and designated the U.S., the entire contents of which are incorporated herein by reference.

FIELD

The embodiments described herein relate to thermoelectric conversion devices.

BACKGROUND

Up to now, energies are emitted, after being used in factories and power plants, in transportation vehicles like automobiles, and also in information processing devices like computers, into the environment in the form of waste heat. Thus, thermoelectric conversion devices capable of recovering and converting such waste heat again to energy attract attention.

A thermoelectric conversion device of the type that uses Seebeck effect is capable of recovering waste heat from various systems and converting the same into electric power while not needing working fluids or complex driving mechanisms, in contrast to conventional thermoelectric conversion systems.

Particularly, strontium titanate ($SrTiO_3$), which has been studied conventionally for application to ferroelectric devices, is free from rare and toxic materials such as tellurium, bismuth, and the like, used in conventional thermoelectric conversion devices and at the same time is capable of realizing a large Seebeck coefficient S that reaches as much as 0.8 $mVK^{-1}$ at 300K. Further, strontium titanate is capable of attaining a relatively large power factor PF, defined as $S^2\sigma$ ($PF=S^2\sigma$), of 30-40 $\mu W/cm \cdot K^2$. Thus, strontium titanate is a promising material for thermoelectric conversion devices. Here $\sigma$ stands for electrical conductivity of the thermoelectric conversion device. The power factor PF can also be represented as $S^2qn\mu$ ($PF=S^2\sigma=S^2qn\mu$), wherein n stands for carrier concentration per unit volume, q stands for carrier electric charge and $\mu$ stands for carrier mobility.

RELATED-ART DOCUMENTS

Non-Patent Reference 1

Zide, J. M., et al. Phys. Rev. B74, 205335 (2006) pp 205335-1-205335-5.

However, in the system of $SrTiO_3$, while the power factor PF can reach the value of 35 $\mu W/cmK^2$-40 $\mu W/cmK^2$, the thermal conductivity $\kappa$ takes a large value of 11 W/mK when $SrTiO_3$ is in the form of a balk crystal, and the value of the "figure of merit" ZT, defined by $$ZT=PF \cdot T/\kappa,\qquad \text{Eq. (1)}$$

is limited. In Eq. (1), it should be noted that T is the absolute temperature, PF is the performance factor of $SrTiO_3$ and $\kappa$ is the thermal conductivity of $SrTiO_3$.

In order to obtain a large figure of merit ZT in such a thermoelectric conversion device of $SrTiO_3$, it is effective to increase the value of the Seebeck coefficient S in view of the fact that the term for the power factor PF is given as $$PF=S^2\sigma.\qquad \text{(Eq. 2)}$$

SUMMARY

In an aspect, there is provided a thermoelectric conversion device that includes: a substrate; a stack in which a first perovskite dielectric film, which includes Sr and Ti and has a first bandgap, and a second perovskite dielectric film, which includes Sr and Ti and has a second bandgap smaller than the first bandgap, are stacked alternately such that the stack is formed over the substrate; a first electrode in electrical connection to a top end of the stack; and a second electrode in electrical connection to a bottom end of the stack, each of the first and second perovskite dielectric films being doped to have an electric conductivity, the first and the second perovskite dielectric films having respective compositions such that there appears a bandoffset of 0.54 eV in maximum between a conduction band of the first perovskite dielectric film and a conduction band of the second perovskite dielectric film, there being induced an electromotive force between the top end and the bottom end of the stack when the top end of the stack is exposed to a first temperature and the bottom end of the stack is exposed to a second temperature.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF THE DRAWINGS

FIG. 3 is a cross-sectional diagram representing the construction of the thermoelectric conversion device of the embodiment;

FIG. 4 is a diagram explaining the operation of the thermoelectric conversion device of the embodiment by referring to a part of the structure represented in FIG. 3;

DESCRIPTION OF EMBODIMENTS

Embodiment

As is well known in the art, Seebeck effect is inherently a thermoelectric conversion phenomenon that occurs as a result of heat transportation of carriers. The present embodiment attains a large power factor PF and a figure of merit ZT in a thermoelectric conversion device that utilizes Seebeck effect by using a highly doped $SrTiO_3$ crystal. Thereby, with the present embodiment, there is attained improvement for the value of the Seebeck coefficient S by eliminating those carriers that are released onto the conduction band $E_{CB}$ as a result of doping of the $SrTiO_3$ crystal but having energy lower than the Fermi level $E_F$, by way of applying energy filtering.

Figure 1:
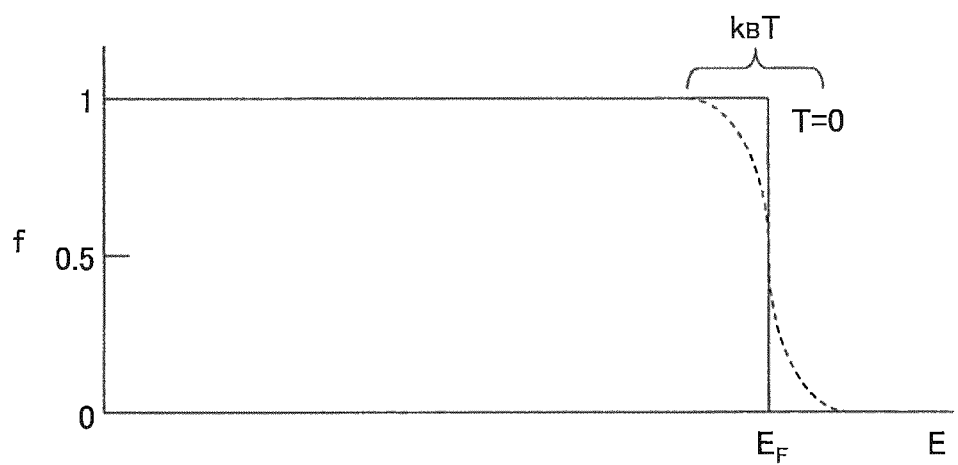
FIG. 1 is a diagram illustrating a Fermi-Dirac distribution function.

FIG. 1 represents a well-known Fermi-Dirac distribution function f(E).

Figure 2:
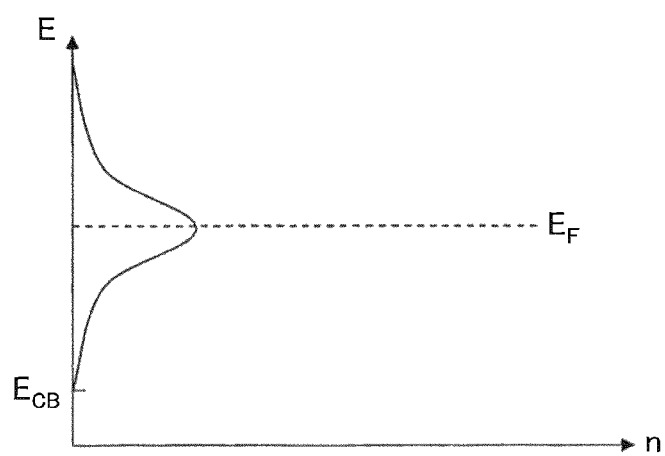
FIG. 2 is a diagram representing a distribution of carriers occurring in a thermoelectric conversion device according to an embodiment.

Referring to FIG. 1, the Fermi-Dirac distribution function f(E) takes a value "1" at absolute zero as represented by a continuous line up to a predetermined Fermi level $E_F$ and a value "0" when the Fermi level $E_F$ is exceeded. At a temperature T, on the other hand, the electrons in the energy range of $k_BT$ about the Fermi level $E_F$ are thermally excited as represented by a dotted line. Thus, in the case of a doped $SrTiO_3$ crystal, the thermally excited carriers (electrons) on the conduction band $E_{CB}$ form a distribution profile as schematically depicted in the band diagram of FIG. 2 wherein it can be seen that there appears a maximum in the concentration n at the Fermi level $E_F$. Here, FIG. 2 represents a part of the schematic energy structure of a doped $SrTiO_3$ crystal and the vertical axis represents the energy E while the horizontal axis represents the carrier density n.

Generally, a Seebeck coefficient S is given as:

$$S = \frac{1}{qT} \frac{\int \sigma(E)(E-E_F)dE}{\int \sigma(E)dE} \quad \text{(Eq. 3)}$$

$$\sigma(E) = q^2\tau(E)v^2(E)D(E)\left(\frac{-df}{dE}\right), \quad \text{(Eq. 4)}$$

wherein q designates a carrier charge, T designates a temperature, $E_F$ designates the Fermi level, a σ(E) designates a conductivity of the carrier of energy E, τ(E) designates the relaxation time at the energy E, υ(E) designates the carrier velocity at the energy E, D(E) designates the density of state at the energy E, and f(E) designates the Fermi-Dirac distribution function at the energy E. Further, the electric conductivity σ in Equation (2) is represented as follows.

$$\sigma = \int \sigma(E)dE. \quad \text{(Eq. 5)}$$

In Eqs. (3) and (4), it can be seen that the integral defining the Seebeck coefficient S includes a kernel that includes the term $E-E_F$. Thus, it will be understood that, when the integration oil the Seebeck coefficient S is taken from the bottom edge of the conduction band $E_{CB}$ to the top edge thereof, the integral taken in the range of energy E lower than the Fermi Level $E_F$ and the integral taken in the range of energy E higher than the Fermi level $E_F$ cancel with each other more or less because of the fact that the integration kernel contains the term $E-E_F$. Thus, there have been circumstances in which only small Seebeck coefficients are obtained even when a material such as a $SrTiO_3$ crystal that would inherently provide a large Seebeck coefficient S is used.

Thus, the present embodiment provides a thermoelectric conversion device 20 of the type that uses a doped $SrTiO_3$ crystal in which the part of the carriers represented in FIG. 2 and having the energy E lower than the Fermi level $E_F$ are eliminated by filtering.

FIG. 3 is a cross-sectional diagram representing the construction of the thermoelectric conversion device 20 of the present embodiment.

Referring to FIG. 3, the thermoelectric conversion device 20 is constructed on a $SrTiO_3$ substrate 21 and includes, on the $SrTiO_3$ substrate 21, a stacked structure 22 in which highly doped first and second perovskite dielectric layers 22A and 22B are stacked repeatedly and alternately. Further, a first electrode 23A is formed on the first perovskite dielectric layer 22A which is in contact with the $SrTiO_3$ substrate 21, and there is provided a second electrode 23B in the illustrated example at the top of the stacked structure 22 in contact with the second perovskite dielectric layer 22B.

With such a thermoelectric conversion device 20, there is induced an electromotive force between the first electrode 23A and the second electrode 23B by heating or cooling the bottom of the stacked structure 22 via the substrate and by cooling or heating the top thereof via the electrode 23B. The electromotive force thus induced are taken out to output terminals $OUT_1$ and $OUT_2$ respectively connected to the first electrode 23A and the second electrode 23B.

With the present embodiment, the composition of the first and second perovskite dielectric layers 22A and 22B are set such that there appears a bandoffset ΔΦ schematically represented in FIG. 4 in the conduction bands $E_{CB}$ between mutually adjacent first perovskite dielectric layer 22A and the second perovskite dielectric layer 22B. Here, it should be noted that FIG. 4 is a cross-sectional diagram of the stacked structure 22 represented in superposition with the conduction bands $E_{CB}$ of the first and second perovskite dielectric layers 22A and 22B and further in superposition with the carrier distribution profile of FIG. 2. In FIG. 4, $E_F$ represents the Fermi level.

Now, with reference to FIG. 4, a case is considered in which electrons $e^-$ having a distribution profile $D_1$ corresponding to the distribution profile of FIG. 2 are caused to flow in the stacked structure 22 in which the band offset ΔΦ is formed between mutually adjacent first and second perovskite dielectric layers 22A and 22B, such that the electrons $e^-$ flow from a first end to an opposite end of the stacked structure. In such a case, the electrons are blocked by the potential barrier formed by the second perovskite dielectric layer 22B as represented in the drawing by an arrow when the energy E of the electrons is lower than the band offset ΔΦ. Thus, only those electrons having energy higher than the band offset ΔΦ can pass through the stacked structure and reach the opposite end. Thus, the electrons reaching the opposite end are formed mostly of electrons having energy higher than the band offset ΔΦ and thus have a carrier distribution profile D2 in which the energy lower than the band offset ΔΦ is cut off.

In FIG. 4, it should be noted that the horizontal axis represents the direction of stacking of the first and second perovskite dielectric layers 22A and 22B and the vertical axis E corresponds to the energy axis of the band diagram of the condition band $E_{CB}$ in a manner superimposed to the cross-sectional structure of FIG. 4. Further, the axis n in the diagram is an axis representing the carrier concentration corresponding to the carrier distribution profiles $D_1$ and $D_2$ in a manner superimposed to the cross-sectional structure of FIG. 4.

Meanwhile, in the stacked structure of FIG. 4, it is expected that the relationship between the Fermi level $E_F$ and the carrier distribution profiles $D_1$ and $D_2$ with regard to the conduction band $E_{CB}$ may change depending upon the doping concentration of the first and second perovskite dielectric layers 22A and 22B. Thus, when the doping concentration is increased, there may be caused a shift of the Fermi level $E_F$ and also a shift of the carrier distribution profiles $D_1$ and $D_2$ in the direction toward higher energy side. In such a case, it is expected that the value of the optimum band offset $\Delta\Phi$ for filtering out the lower-half part of the distribution profile $D_1$ may be changed.

Figure 5A:
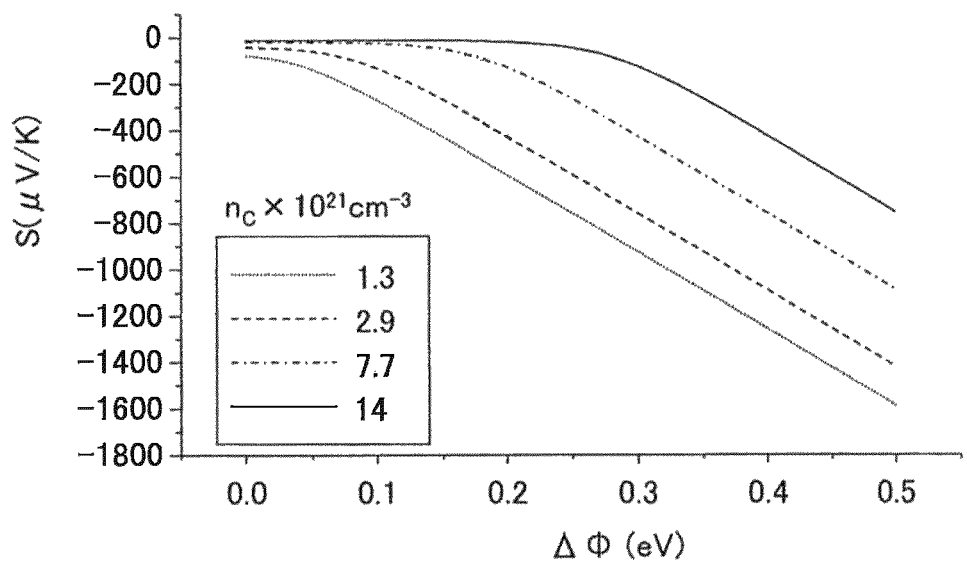
FIG. 5A is a graph representing the relationship between a Seebeck coefficient S and a bandoffset $\Delta\Phi$ obtained for the embodiment.

FIG. 5A represents examples of obtaining the Seebeck coefficient S for the case a band offset of 0.0 eV-0.5 eV is formed in a dielectric film of a $SrTiO_3$ crystal of various doping levels.

Referring to FIG. 5A, the Seebeck coefficient S is obtained for the cases in which the doping level is $1.3\times10^{21}$ $cm^{-3}$, $3.9\times10^{21}$ $cm^{-3}$, $7.7\times10^{21}$ $cm^{-3}$ and $14\times10^{21}$ $cm^{-3}$, wherein it will be noted that the value of the Seebeck coefficient S is almost zero in any of the doping levels in the case when the band offset $\Delta\Phi$ is zero and hence the energy filtering is not applied. On the other hand, when the band offset $\Delta\Phi$ is increased, there is a general tendency that the absolute value of the Seebeck coefficient S is increased also. Thereby, it will be noted that, in the case the doping level is low, as in the example in which the carrier density takes the value of $1.3\times10^{21}$ $cm^{-3}$, a value of $-300$ $\mu V/K$ is obtained for the Seebeck coefficient S when the band offset $\Delta\Phi$ is 0.1 eV. However, when the doping level is higher and the carrier density takes the value of $14\times10^{21}$ $cm^{-3}$, for example, it can be seen that the value of the Seebeck coefficient S remains almost zero as long as the band offset $\Delta\Phi$ takes the same value of 0.1 eV. Thus, it will be noted that, in the case of high doping level such as the carrier density of $14\times10^{21}$ $cm^{-3}$, the foregoing value of $-300$ $\mu V/K$ is attained for the first time when the band offset has reached a higher value such as about 0.4 eV.

Thus, FIG. 5A clearly demonstrates the filtering effect of the carrier energy on the Seebeck coefficient S, and it can be seen that the absolute value of the Seebeck coefficient S can be increased in the model structure of the thermoelectric conversion device that includes the band offset such as the one represented in FIG. 4, by increasing the value of the band offset $\Delta\Phi$. It should be noted that FIG. 5A is obtained by simulation.

On the other hand, in the case the band offset $\Delta\Phi$ is introduced into the stacked structure that constitutes the thermoelectric conversion device, it is also expected that the transport of the carriers from the bottom end to the top end or from the top end to the bottom end of the stacked structure of FIG. 4 may be obstructed. In such a case, there may be caused a decrease in the electric conductivity $\sigma$.

Figure 5B:
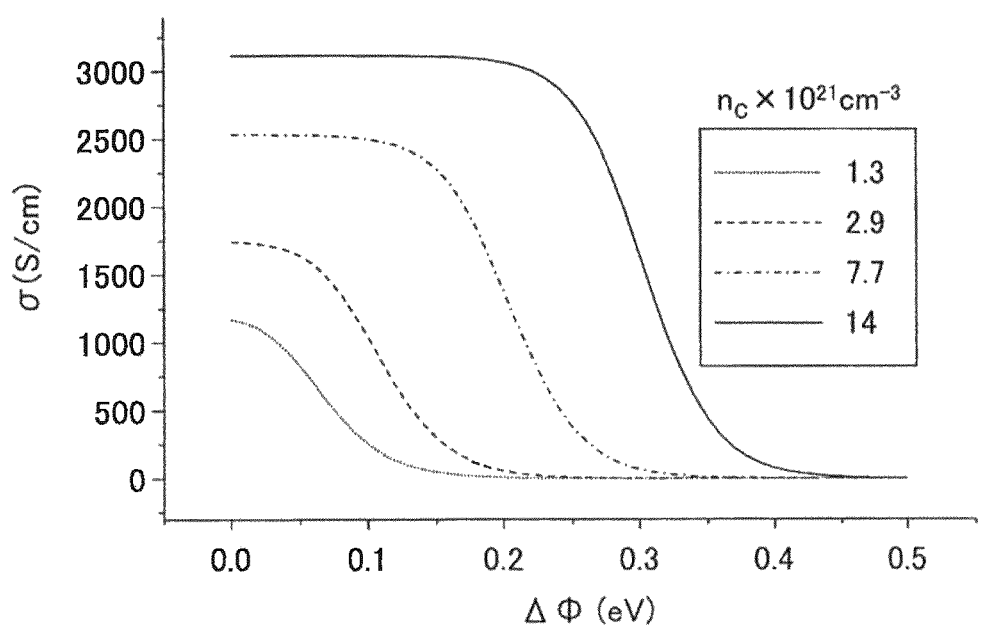
FIG. 5B is a graph representing the relationship between an electric conductivity $\sigma$ and the bandoffset $\Delta\Phi$ obtained for the embodiment.

In fact, as represented in FIG. 5B, there can be seen a tendency that the value of the electric conductivity $\sigma$ is decreased with increase of the band offset $\Delta\Phi$ when the band offset is introduced into the stacked structure 22. It should be noted that the relationship of FIG. 5B, too, is obtained by simulation.

Referring to FIG. 5B, it can be seen that the electric conductivity $\sigma$ takes various values depending upon the doping level of the $SrTiO_3$ crystal in the case the band offset $\Delta\Phi$ is zero, while in the case the value of the band offset $\Delta\Phi$ has reached 0.1 eV, it can be seen that the electric conductivity $\sigma$ becomes almost zero. This indicates that the conduction electrons are cut off by the potential barriers introduced into the $SrTiO_3$ film. This further indicates that the Fermi level $E_F$ is located at 0.1 eV or lower from the bottom edge of the conduction band $E_{CB}$ in the case the carrier density is $1.3\times10^{21}$ $cm^{-3}$.

On the other hand, in the case the carrier density is $14\times10^{21}$ $cm^{-3}$, it can be seen that the value of the electric conductivity $\sigma$ exceeds 3000 S/cm when the band offset $\Delta\Phi$ is set to 0.1 eV. This suggests that the Fermi level $E_F$ is located much higher than 0.1 eV from the bottom edge of the conduction band $E_{CB}$.

Meanwhile, the power factor PF of the thermoelectric conversion device is given by the equation $PF=S^2\sigma$ as noted before. Thus, in view of the mutually tradeoff relationship between the Seebeck coefficient S and the electric conductivity $\sigma$ as represented in FIGS. 5A and 5B, it will be noted that, in order to maximize the power factor PF, there is a need to set the value of the band offset $\Delta\Phi$ in the $SrTiO_3$ film that constitutes the thermoelectric conversion device appropriately in accordance with the doping level, and hence in accordance with the carrier density.

Figure 6:
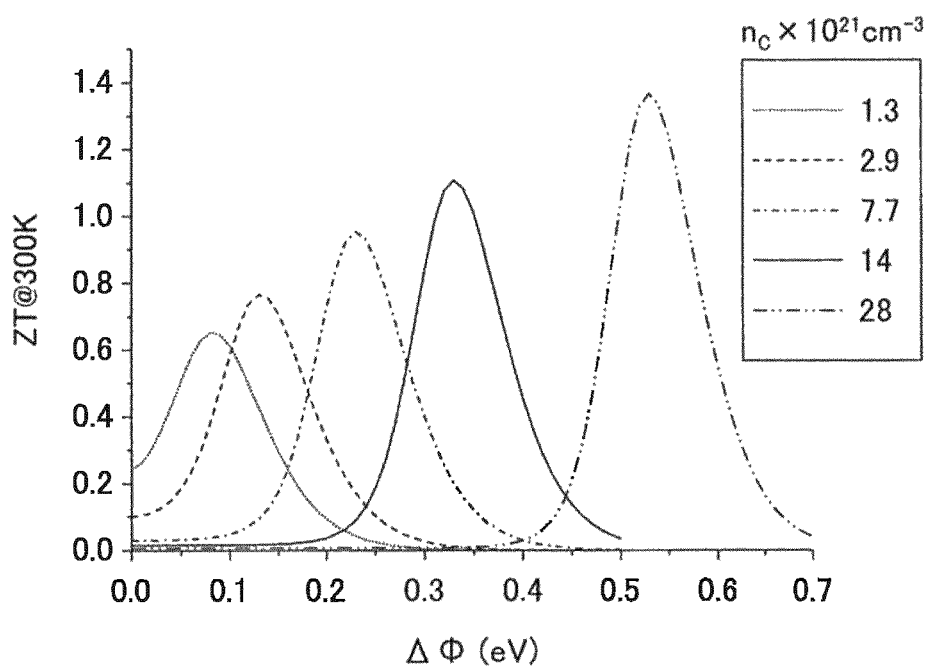
FIG. 6 is a graph representing the relationship between a figure of merit ZT and the bandoffset $\Delta\Phi$ obtained for the embodiment.

FIG. 6 is a graph representing the results of simulation conducted for the relationship between the figure of merit ZT of the stacked structure 22 of FIG. 4 and the band offset $\Delta\Phi$ for various carrier densities. It should be noted that FIG. 6 represents the results for the temperature of 300K.

Referring to FIG. 6, it can be seen that there exists a value of the band offset $\Delta\Phi$ that maximizes the figure of merit ZT for each of the carrier densities. For example, in the case the carrier density is $1.3\times10^{21}$ $cm^{-3}$, the figure of merit ZT becomes maximum when the band offset $\Delta\Phi$ is set to about 0.07 eV, Further in case the carrier density is $28\times10^{21}$ $cm^{-3}$, the figure of merit ZT becomes maximum when the band offset $\Delta\Phi$ is set to about 0.54 eV. In this case, the figure of merit of about 1.4 is attained even at the temperature of 300K.

Figure 7:
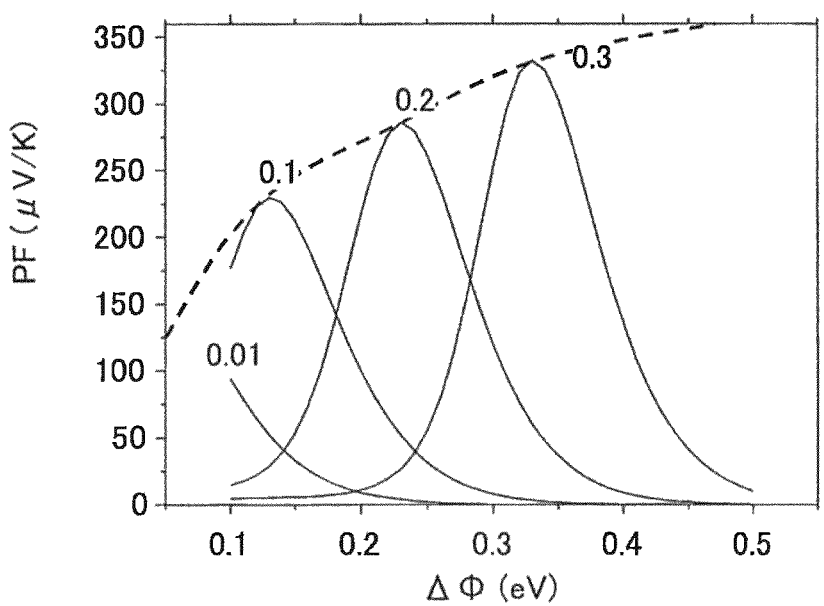
FIG. 7 is a graph representing the relationship between a power factor PF and the bandoffset $\Delta\Phi$ obtained for the embodiment.

Further, FIG. 7 is a graph representing the relationship between the power factor PF of the thermoelectric conversion device 20 of the present embodiment and the band offset $\Delta\Phi$ thus obtained. The relationship of FIG. 7, too, is obtained by simulation.

In FIG. 7, the labels "0.01", "0.1", "0.2" and "0.3", etc. represent the energy differences between the Fermi level $E_F$ and the conduction band $E_{CB}$ in terms of electron volt. Referring to FIG. 7, it can be seen that the power factor PF is increased with increase of the Fermi level $E_F$, and hence with the doping level. By extrapolating this tendency along a broken line, it will be understood that a power factor PF exceeding 350 $\mu V/K$ is attained when the value of the band offset $\Delta\Phi$ is 0.54 eV.

With the thermoelectric conversion device 20 of the present embodiment, the first perovskite dielectric layer 22A and the second perovskite dielectric layer 22B are formed to have respective compositions $SrZr_xT_yO_3$ and $SrZr_mT_nO_3$, and the foregoing band offset $\Delta\Phi$ is induced at the interface of the mutually adjacent first and second perovskite dielectric layers 22A and 22B by suitably setting the values of the compositional parameters x and y and m and n.

Figure 8:
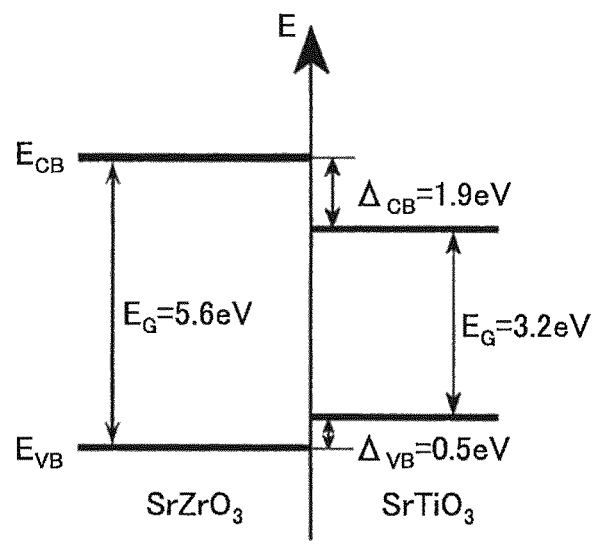
FIG. 8 is a diagram representing a band structure of a $SrZrO_3/SrTiO_3$ junction surface.

FIG. 8 represents the band structure of a junction part of a $SrTiO_3$ crystal and a $SrZrO_3$ crystal.

Referring to FIG. 8, the $SrZrO_3$ crystal has a bandgap Eg of 5.6 eV while the $SrTiO_3$ crystal has a smaller bandgap of 3.2 eV, and thus, it will be understood that there appears a band offset $\Delta_{CS}$ of 1.9 eV in the maximum in the structure in which a first perovskite dielectric film and a second perovskite dielectric layer 223 having the respective compositions of $Sr_xTi_yO_3$ and $SrZr_mTi_nO_3$ are stacked alternately.

Figure 9:
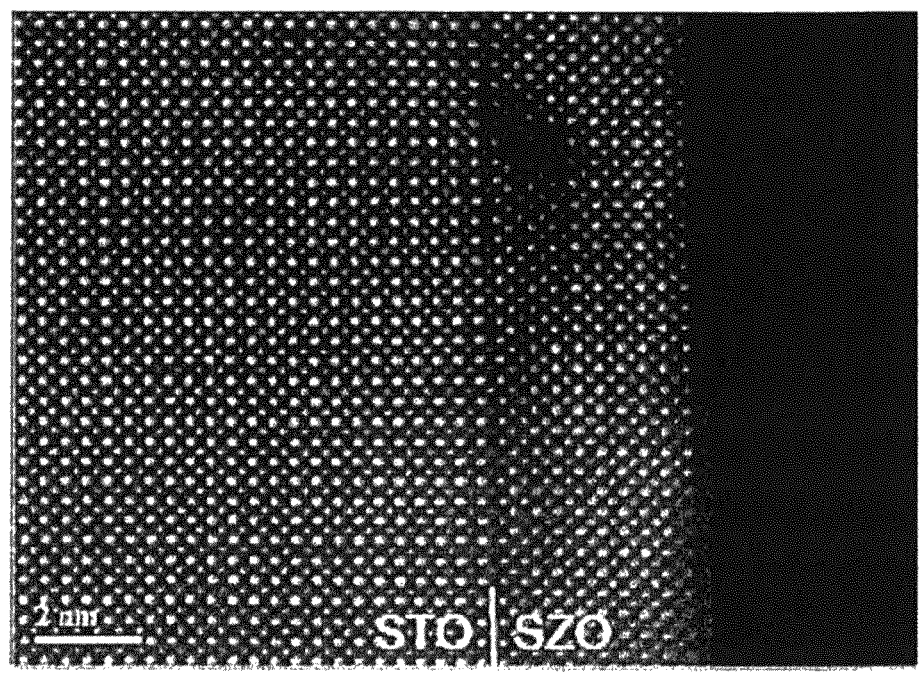
FIG. 9 is a transmission electron microscopic image demonstrating lattice matching attained at the $SrZrO_3/SrTiO_3$ junction surface.

FIG. 9 represents a transmission electron microscopic image for a cross section of a structure in which a $SrZrO_3$ layer is grown epitaxially on a $SrTiO_3$ substrate.

From FIG. 9, it can be seen that the SrZrO$_3$ layer is grown on the SrTiO$_3$ substrate in lattice matching thereto and there is attained an epitaxial relationship between the SrZrO$_3$ layer and the SrTiO$_3$ substrate. Such epitaxy is maintained as long as the film thickness of the SrZrO$_3$ layer does not exceed a predetermined critical film thickness, such as 100 nm for example. In the case of the stacked structure 22 of FIG. 4, the difference of lattice constant between the first perovskite dielectric layer 22A and the second perovskite dielectric layer 22B is expected to be smaller than the difference of lattice constant between the SrZrO$_3$ layer and the SrTiO$_3$ substrate, and because of this, it is possible for the first perovskite dielectric layer 22A and the second perovskite dielectric layer 22B to maintain the epitaxy even when they are formed with a larger film thickness. In the present embodiment, the first perovskite dielectric layer 22A and the second perovskite dielectric layer 22B may have the film thickness in the range of 0.4 nm-500 nm.

Next, doping of the first perovskite dielectric layer 22A and the second dielectric layer 22B in the stacked structure 22 of FIG. 4 will be considered.

In the present embodiment, the doping of the first perovskite dielectric layer 22A of the composition represented by SrZr$_x$Ti$_y$O$_3$ and the doping of the second perovskite dielectric layer 22B of the composition represented by SrZr$_m$Ti$_n$O$_3$ are conducted by the doping of La and/or Nb or oxygen defects.

Figure 10:
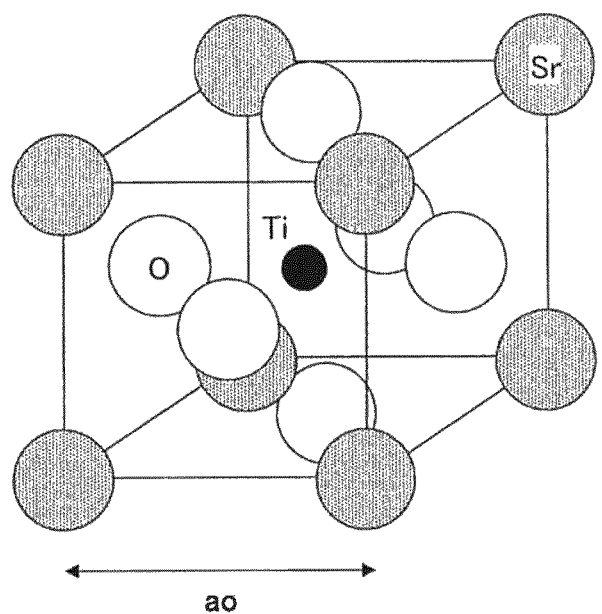
FIG. 10 is a diagram representing a unit cell of $SrTiO_3$.

FIG. 10 is an oblique view diagram representing a unit cell of the perovskite structure constituting the first perovskite dielectric layer 22A of the second perovskite dielectric layer 22B.

Referring to FIG. 10, a La atom substitutes the A-site occupied with a Sr atom and becomes a donor by releasing a carrier electron. Further, a Nb atom substitutes the B-site occupied with a Ti atom and becomes also a donor by releasing a carrier electron. Further, it is also possible to substitute the A-site and the B-site simultaneously by the La atom and the Nb atom. Further, oxygen defect, formed by decoupling of the oxygen atom in the oxygen site, also becomes a donor.

On the other hand, because a unit cell of the perovskite structure contains only one Sr atom and only one Ti atom as will be understood from FIG. 10, no further doping is possible when they are substituted with La or Nb. Designating the length of one edge of the unit cell of FIG. 9 as $a_0$, there are included $1/a_0^3$ unit cells in a unit volume, and thus, the maximum possible carrier density $n_{max}$ attainable in such a perovskite structure with the doping of the A-site or B-site is about $16.6 \times 10^{22}$ cm$^{-3}$. No further doping is possible. In the case of the doping by the oxygen defects, a carrier density of $33.2 \times 10^{22}$ cm$^{-3}$, which is twice as large as the former value, becomes the maximum. Furthermore, in the case the A-site and the B-site are doped simultaneously with La and Nb, the maximum possible carrier density becomes $33.2 \times 10^{22}$ cm$^{-3}$.

Thus, based on the relationship of the figure of merit ZT of FIG. 6, the value of the band offset ΔΦ providing the maximum figure of merit ZT becomes 0.34 eV for case of the carrier density of $16.6 \times 10^{22}$ cm$^{-3}$. Further, in the case of the carrier density of $33.2 \times 10^{22}$ cm$^{-2}$, a value of 0.54 eV is obtained for the band offset ΔΦ corresponding to the maximum of the figure of merit ZT.

This means that, in order to maximize the figure of merit ZT in the thermoelectric conversion device 20 of FIG. 3 or FIG. 4, it is preferable to adjust the compositions of the first perovskite dielectric layer 22A and the second perovskite dielectric layer 22B such that the value of the band offset ΔΦ becomes 0.34 eV in the case the A-site or the B-site of the first perovskite dielectric layer 22A and the second perovskite dielectric layer 22B is doped with La or Nb. In the case both of the A-site and the B-site of the first perovskite dielectric layer 22A and the second perovskite dielectric layer 22B are doped with La and Nb, the foregoing result indicates that it is preferable to adjust the compositions of the first perovskite dielectric layer 22A and the second perovskite dielectric layer 22B such that the value of the band offset ΔΦ becomes 0.54 eV.

Figure 11:
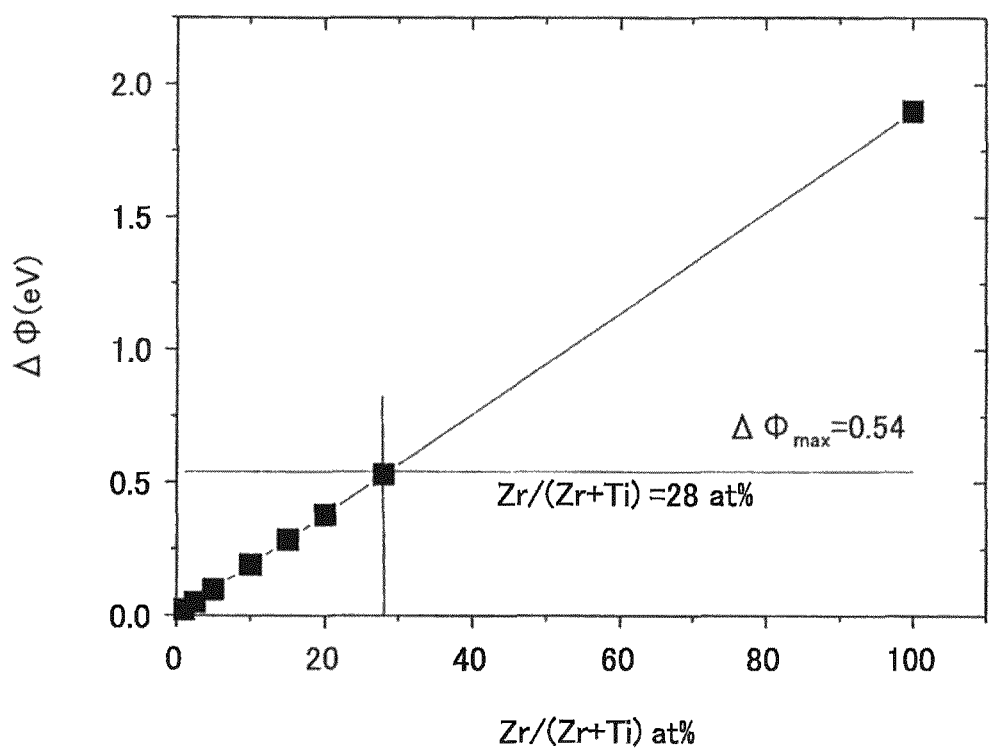
FIG. 11 is a graph representing a relationship between the bandoffset $\Delta\Phi$ and a Zr concentration.

FIG. 11 is a graph representing the relationship between the band offset ΔΦ induced at the interface in which a SrTiO$_3$ film and a Sr(Ti, Zr)O$_3$ film are stacked and the Zr atomic concentration (Zr/(Zr+Ti)) in the Sr(Ti, Zr)O$_3$ film.

Referring to FIG. 11, it can be seen that the band offset ΔΦ takes the value of 0.54 eV when the atomic concentration of Zr in the Sr(Ti, Zr)O$_3$ film has reached 28%. From this, and from the fact that the relationship of FIG. 11 is linear, it becomes possible to form a band offset ΔΦ of 0.54 eV at the interface of the mutually adjacent first and second perovskite dielectric layers 22A and 22B in the stacked structure 22 of FIG. 3 or FIG. 4 by providing a difference of 28 atomic % in the Zr concentration between the first perovskite dielectric layer 22A and the second perovskite dielectric layer 22B. For example, in the case the first perovskite dielectric layer 22A is a SrTiO$_3$ film, the band offset ΔΦ of 0.54 eV can be attained at the interface between the first and second perovskite dielectric layers 22A and 22B by choosing the composition of the second perovskite dielectric layer 22B to Sr(Ti$_{0.72}$, Zr$_{0.28}$)O$_3$. Further, in the case the first perovskite dielectric layer 22A has a composition Sr(Ti$_{0.80}$, Zr$_{0.20}$)O$_3$, the band offset ΔΦ of 0.54 eV can be attained at the interface between the first and second perovskite dielectric layers 22A and 22B by setting the composition of the second perovskite dielectric layer 22B to Sr(Ti$_{0.52}$, Zr$_{0.48}$)O$_3$.

Further, with the present embodiment, it is preferable to ser the film thicknesses of the first and second perovskite dielectric layers 22A and 22B as large as possible within the critical film thicknesses thereof for suppressing the tunneling of the carriers. It should be noted that the respective critical film thicknesses are determined by the lattice constant difference between the first and second perovskite dielectric layers 22A and 22B, and hence by the compositional difference thereof. For example, the critical thicknesses may have the value of 10 nm respectively. Thus, in the present embodiment, it is possible to form the first and second perovskite dielectric layers 22A and 22B to the film thickness of the foregoing values of 50 nm, for example. At least one of the first and second perovskite dielectric layers 22A and 22B may have a film thickness of 0.4 nm-500 nm.

Further, by increasing the number of repetition of the first and second perovskite dielectric layers 22A and 22B, it becomes possible to reduce the proportion of the carriers passing through the potential barriers formed in the stacked structure by tunneling.

Figure 12:
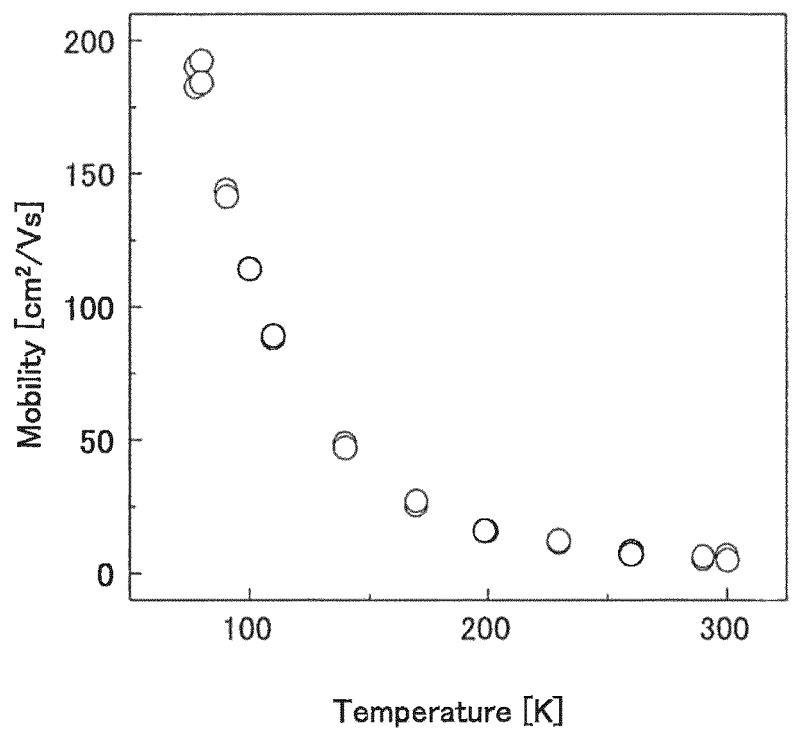
FIG. 12 is a graph demonstrating the increase of carrier mobility at low temperature.

FIG. 12 represents the relationship between the carrier mobility μ and temperature in a SrTiO$_3$ crystal.

Referring to FIG. 12, it can be seen that while the value of the mobility μ takes the range of 10 cm$^2$/Vs-25 cm$^2$/Vs in the temperature range of 250K to 300K for the SrTiO$_3$ crystal, the value of the mobility increases sharply at the temperature of 250K or lower and exceeds the value of 180 cm$^2$/V at 40K, for example, because of the reasons such as the carrier transportation becomes ballistic and the length of the mean free path of the carriers exceeds the film thickness. At the temperature of 4K, the value of mobility μ exceeds 30,000 cm$_2$/V.

As explained previously, the power factor PF includes the mobility μ in the form of $PF=S^2\sigma=S^2q n \mu$, and thus, it will be understood from FIG. 12 that a particularly large power factor PF and the figure of merit ZT are attainable when the thermoelectric conversion device of FIGS. 3 and 4 is operated at a lower temperature of 250K or lower, more preferably at 200K or lower, more preferably at 100K or lower. For example, it becomes possible to improve the power factor PF and the figure of merit ZT by using a low temperature source of 250K or less for cooling in the construction of FIG. 3. The thermoelectric conversion device 20 of FIG. 3 is suitable for recovering the waste heat when operating a heat engine in a ultralow temperature environment such as polar region, outer space, and the like.

Of course, the thermoelectric conversion device 20 of FIG. 3 is effective also for recovery of waste heat from a heat engine operating at room temperature.

Next, explanation will be made about the fabrication process of the thermoelectric conversion device 20 of FIGS. 3 and 4.

Figure 13:
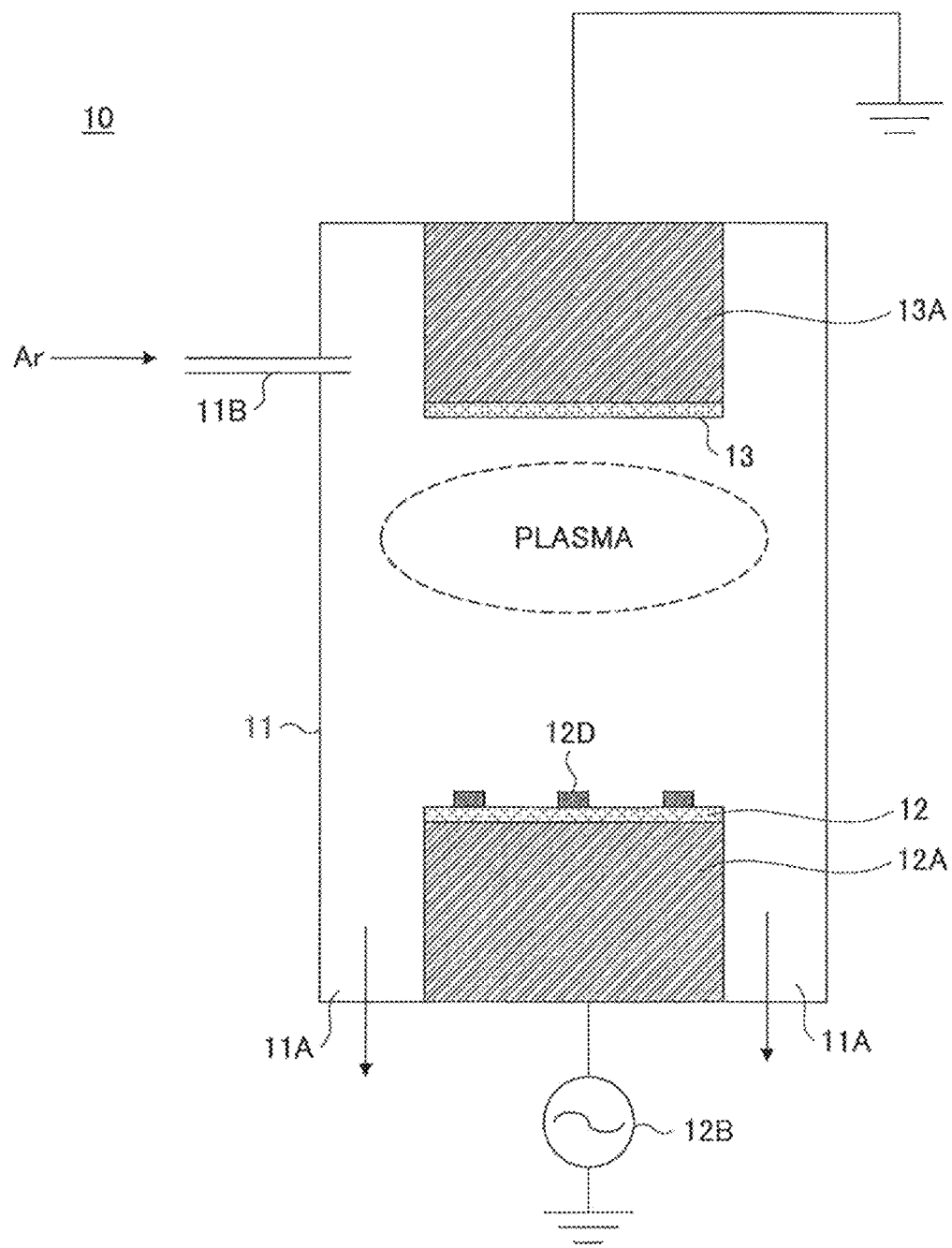
FIG. 13 is a diagram explaining a fabrication process of the thermoelectric conversion device of the embodiment by using a high-frequency sputtering apparatus.

FIG. 13 is a diagram representing the construction of a sputtering apparatus 10 used for forming the first and second perovskite dielectric layers 22A and 22B in the foregoing embodiment.

Referring to FIG. 13, the sputtering apparatus 10 includes a vacuum vessel 11 introduced with a sputtering gas such as Ar from a sputtering gas introduction port 11B and is evacuated to high-degree vacuum at an evacuation port 11A, and there is provided a target holder 12A for holding a target of a $SrTiO_3$ composition at a lower part of the vacuum vessel 11. Further, there is provided a substrate holder 12A holding a substrate 13 to be processed in correspondence to the $SrTiO_3$ substrate 21 at a top part of the vacuum vessel 11 so as to face the target 12.

The target holder 12A is connected to a high-frequency power supply 12B, and the components of the target 12 are sputtered out from the target 12 when a high-frequency power is supplied from the high-frequency power source 12B to the target 12 via the target holder 12A. More specifically, there is formed plasma in the vacuum vessel 11 between the target 12 and the substrate 13, and the sputtering occurs as a result of the plasma thus formed cause collision to the target 12.

Further the substrate holder 13A is grounded, and the components sputtered out from the target 12 cause deposition upon the $SrTiO_3$ substrate 21 held on the substrate holder 13A. As a result of the deposition, there occurs formation of a perovskite dielectric film for the desired perovskite dielectric layer 22A or 22B on the substrate 13. In the description below, it is assumed that the perovskite dielectric film forming the first perovskite dielectric layer 22A (hereinafter "first perovskite dielectric film 22A") has the composition of $SrTiO_3$ and the perovskite dielectric film forming the second perovskite dielectric layer 22B (hereinafter "second perovskite dielectric film 22B") has a composition of $Sr(Ti, Zr)O_3$. It should be noted, however, that the first and second perovskite dielectric films 22A and 22B may have the compositions of $SrTi_xZr_yO_3$ and $SrTi_mZr_nO_3$, respectively.

In this process, metal foils 12D of the metal element to be doped into the strontium titanate film are disposed upon the target 12 with a predetermined proportion in the sputtering apparatus 10 of FIG. 12, and with this, it becomes possible to dope the $SrTiO_3$ films deposited upon the substrate 13 with the desired metal element with the desired proportion.

Figure 14:
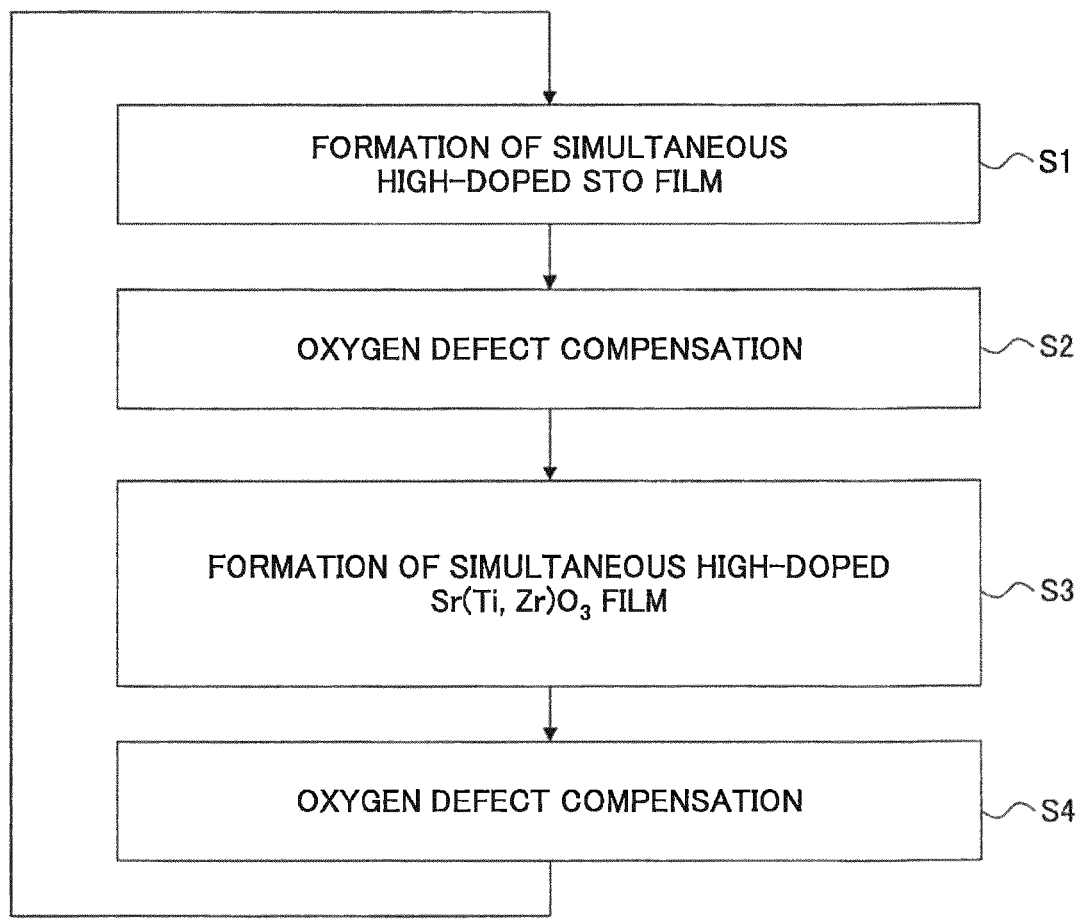
FIG. 14 is a flowchart explaining the fabrication process of the thermoelectric conversion device of the embodiment.

Next, referring to the flowchart of FIG. 14, the present embodiment holds, in a step 1 of FIG. 14, the $SrTiO_3$ substrate 21 on the substrate holder 13A as the substrate 13 to be processed, and a $SrTiO_3$ film highly doped with La and Nb is formed epitaxially on the $SrTiO_3$ substrate 21 as the first perovskite dielectric film 22A while using the sputtering apparatus 10 of FIG. 13.

The $SrTiO_3$ film 22A thus obtained is thermally annealed in a step 2 in an oxygen ambient to control the oxygen defect concentration of the $SrTiO_3$ film 22A.

Next, in a step 3, the target is further added with a $SrZrO_3$ target, and by carrying out a similar sputtering process, there is formed a film of a $Sr(Ti, ZrO)_3$ composition highly doped with La and Nb on the $SrTiO_3$ film 22A as the second perovskite dielectric film 22B.

Further, the $Sr(Ti, Zr)O_3$ film thus obtained is annealed thermally in an oxygen ambient in a step 4, and the oxygen defect concentration in the layer 22B is controlled.

Further, the process returns to the step 1 and the step 1-Step 4 are repeated as necessary.

It should be noted that the foregoing target change noted with reference to the step 3 can be carried our by using a target switching mechanism, which a standard sputtering apparatus is generally equipped with.

Further, a part of the stacked structure 22 thus obtained is subjected to patterning, and the electrodes 23A and 23B are formed such that the electrode 23A is formed on the surface of the exposed lowermost perovskite dielectric film 22A and the electrode 23B is formed on the surface of the uppermost perovskite dielectric film 22B. With this, the thermoelectric conversion device 20 is completed.

As described already, an output voltage is obtained in the thermoelectric conversion device 20 thus obtained between the terminals $OUT_1$ and $OUT_2$ respectively connected to the electrodes 23A and 23B by heating or cooling the lowermost part of the stacked structure 22 via the substrate 21 and further cooling or heating the uppermost part via the electrode 23B.

According to the foregoing embodiment, it becomes possible, as a result of energy filtering of carriers, to attain a figure of merit ZT exceeding 1.4 and a power factor PF exceeding 350 μV/K in a thermoelectric conversion device that uses a perovskite dielectric film containing Sr and Ti.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A thermoelectric conversion device, comprising:
    a substrate;
    a stack in which a first perovskite dielectric film, which includes Sr and Ti and has a first bandgap, and a second perovskite dielectric film, which includes Sr and Ti and has a second bandgap smaller than the first bandgap, are stacked alternately, the stack being formed over the substrate;
    a first electrode in electrical connection to a top end of the stack; and
    a second electrode in electrical connection to a bottom end of the stack,
    each of the first and second perovskite dielectric films being doped to have an electric conductivity,
    the first and the second perovskite dielectric films having respective compositions such that there appears a band-offset of 0.54 eV in maximum between a conduction band of the first perovskite dielectric film and a conduction band of the second perovskite dielectric film, there being induced an electromotive force between the top end and the bottom end of the stack when the top end of the stack is exposed to a first temperature and the bottom end of the stack is exposed to a second temperature.

2. The thermoelectric conversion device as claimed in claim 1, wherein the first perovskite. dielectric film further includes Zr, the second perovskite dielectric film has a composition of $SrTiO_3$, and wherein the first perovskite dielectric film has a Zr concentration, defined as Zr/(Zr+Ti), in a perovskite B-site such that the Zr concentration does not exceed 28 atomic percent.

3. The thermoelectric conversion device as claimed in claim 1, wherein each of the first and second perovskite dielectric films further includes Zr, a Zr concentration, defined by Zr/(Zr+Ti), in a perovskite B-site of the second perovskite dielectric film is larger than a Zr concentration, defined by Zr/(Zr+Ti), in a perovskite B-site of the first perovskite dielectric film by an amount which does not exceed 28 atomic percent.

4. The thermoelectric conversion device as claimed in claim 1, wherein the first and second perovskite dielectric films are doped with La.

5. The thermoelectric conversion device as claimed in claim 1, wherein the first and second perovskite dielectric films are doped with Nb.

6. The thermoelectric conversion device as claimed in claim 1, wherein the first and second perovskite dielectric films are doped with both La and Nb.

7. The thermoelectric conversion device as claimed in claim 1, wherein the first and second perovskite dielectric films are doped with oxygen defects.

8. The thermoelectric conversion device as claimed in claim 1, wherein at least one of the first and second perovskite dielectric films has a thickness of 0.4 nm-500 nm.

* * * * *